United States Patent
Cortigiani et al.

(10) Patent No.: US 7,649,364 B2
(45) Date of Patent: Jan. 19, 2010

(54) CIRCUIT COMPRISING A MOS TRANSISTOR AND A CONTROL CIRCUIT FOR THE MOS TRANSISTOR

(75) Inventors: Fabrizio Cortigiani, Padua (IT); Gianluca Ragonesi, Padua (IT); Silvia Solda, Padua (IT); Franco Mignoli, Verona (IT)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 11/825,322

(22) Filed: Jul. 5, 2007

(65) Prior Publication Data

US 2008/0068059 A1    Mar. 20, 2008

(30) Foreign Application Priority Data

Jul. 5, 2006    (EP) .................................. 06013945

(51) Int. Cl.
*G01R 35/00* (2006.01)
*G01R 31/28* (2006.01)

(52) U.S. Cl. .................................... 324/601; 324/158.1
(58) Field of Classification Search ................ 324/601, 324/769; 327/427, 434
See application file for complete search history.

(56) References Cited

U.S. PATENT DOCUMENTS

| | | | |
|---|---|---|---|
| 5,625,312 A | 4/1997 | Kawakami et al. | |
| 6,278,305 B1 | 8/2001 | Tanaka | |
| 6,313,689 B1 | 11/2001 | Horchler | |
| 6,696,871 B2 * | 2/2004 | Bienvenu et al. | 327/134 |
| 6,720,819 B1 * | 4/2004 | Yamamoto | 327/427 |
| 7,068,082 B2 * | 6/2006 | Kojima | 327/108 |
| 7,233,469 B2 * | 6/2007 | Vinciarelli et al. | 361/78 |
| 2005/0237094 A1 | 10/2005 | Stark et al. | |

FOREIGN PATENT DOCUMENTS

| | | |
|---|---|---|
| DE | 198 36 577 C1 | 4/2000 |
| DE | 198 55 604 C1 | 6/2000 |
| DE | 101 43 432 C1 | 2/2003 |
| DE | 102 40 167 A1 | 3/2004 |
| EP | 0 817 381 A2 | 1/1998 |
| WO | WO 00/27032 | 5/2000 |

OTHER PUBLICATIONS

Consoli, A. et al. "Conducted Emission Improvement of Modern Gate Controlled Devices." *Ninth International Conference on Electromagnetic Compatibility.* No. 396. Sep. 5-7, 1994. pp. 191-195. (5 Pages).

* cited by examiner

*Primary Examiner*—Amy He
(74) *Attorney, Agent, or Firm*—Maginot, Moore & Beck

(57) ABSTRACT

A circuit includes a MOS transistor having a control electrode and a control capacitance, and including a control circuit for the MOS transistor. The control circuit includes an input to supply a control signal and an output to supply a drive signal, the output being connected to the control electrode of the MOS transistor. A calibration circuit is connected to the control electrode of the MOS transistor, and generates a calibration signal dependent on the capacitance value of the control capacitance. A drive circuit generates the drive signal with an amplitude dependent on the calibration signal as determined by the control signal.

20 Claims, 5 Drawing Sheets

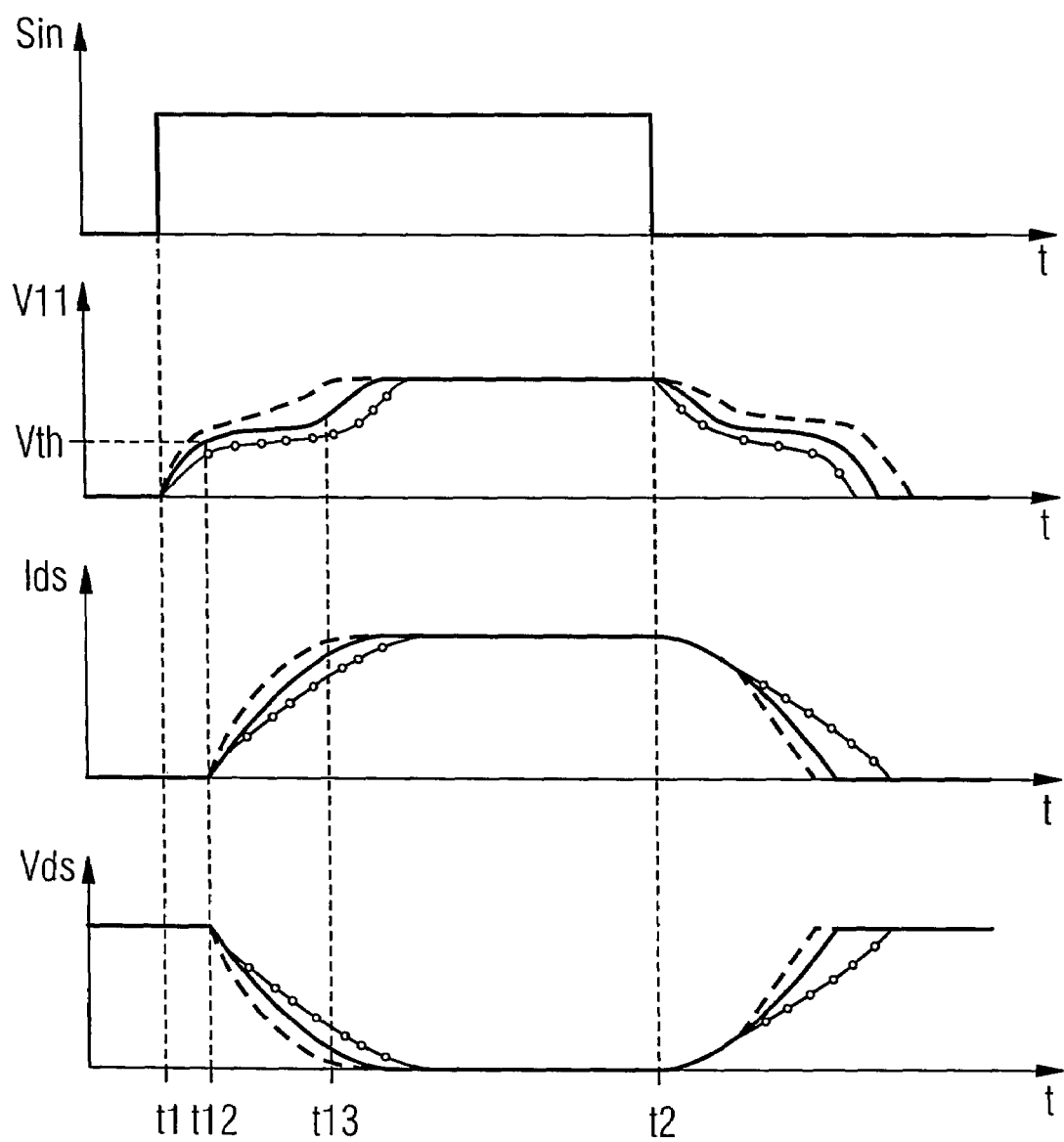

CIRCUIT COMPRISING A MOS TRANSISTOR AND A CONTROL CIRCUIT FOR THE MOS TRANSISTOR

TECHNICAL FIELD

The present invention relates to a circuit comprising a MOS transistor and a control circuit for the MOS transistor.

BACKGROUND

MOS transistors, such as, for example, MOSFETs (Metal Oxide Semiconductor Field-Effect Transistors) or IGBTs (Insulated Gate Bipolar Transistors) are increasingly employed as electronic switches for switching electrical loads. As is known, MOS transistors have a control capacitance or gate capacitance which must be charged for switching on the MOS transistor, i.e. for transferring the MOS transistor into its conducting state, and which capacitance must be discharged for switching off the MOS transistor, i.e. for transferring the transistor into its non-conducting/blocking state. The speed at which this gate capacitance is charged and discharged is determined by the switching behavior of the MOS transistor. Consequently the slope of the switching edges of electrical signals applied across the MOS transistor or across a load connected in series to the MOS transistor. Such electrical signal is a current through the transistor or the load, or a voltage across the load or the transistor and is dependent on the control capacitance. The charging or discharging speed is a function of the amplitude of a charge or discharge current and of the capacitance value of the control capacitance.

The slope of these switching edges fundamentally determines the electromagnetic interference during a switching operation. One method reducing the electromagnetic interference during a switching operation is to "flatten" the switching edges through an appropriate selection of the charge and discharge current.

The value of the control capacitance of a MOS transistor which has a significant effect on the slope of the switching edges is subject to fabrication-related fluctuations. The slope of the switching edges can as a result vary from transistor to transistor given identical charging and discharging currents.

SUMMARY

The circuit according to an example of the invention comprises a MOS transistor with a control electrode and a control capacitance, and a control circuit for the MOS transistor. The control circuit comprises a calibration circuit which is connected to the control electrode of the MOS transistor and which is designed to generate a calibration signal dependent on the capacitance value for the control capacitance, and a drive circuit which is designed to generate the drive signal as determined by a control signal with an amplitude dependent on the calibration signal. By adjusting the amplitude of the drive signal to the calibration value of the control capacitance, this circuit is able to reduce the effect of fabrication-related variations in the drive capacitance on the slope of the switching edges.

BRIEF DESCRIPTION OF THE DRAWINGS

Examples of the invention will be explained based on figures in the following.

FIG. 2 shows, by way of example, the time characteristics for signals occurring within the circuit given conductive and non-conductive control of the MOS transistor.

Unless otherwise indicated, identical reference characters in the figures denote identical circuit components and signals of identical meaning.

DETAILED DESCRIPTION

Figure 1:
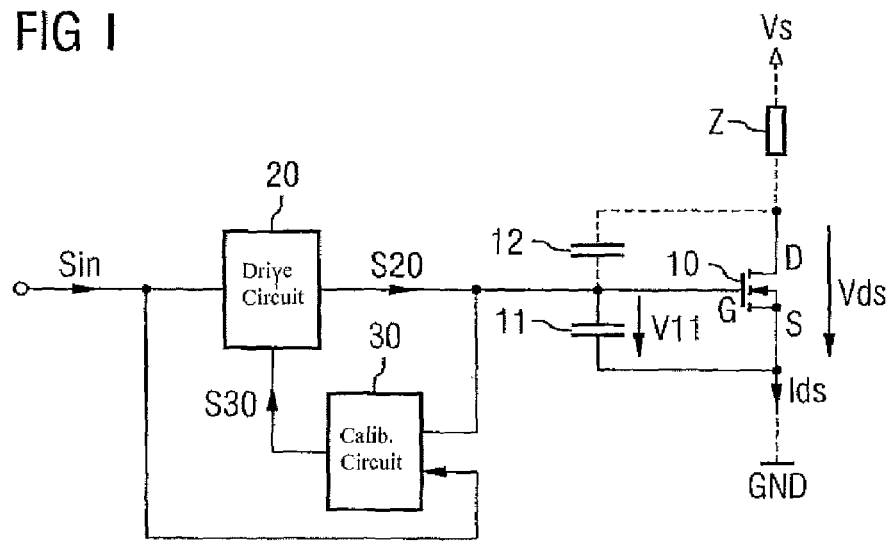
FIG. 1 shows a first example of the circuit according to the invention which has a MOS transistor and a control circuit for the MOS transistor comprising a drive circuit and a calibration circuit.

FIG. 1 shows an example of a circuit according to the invention. The circuit comprises a MOS transistor 10 and a control circuit for the MOS transistor 10, with the control circuit having a drive circuit 20 and a calibration circuit 30.

MOS transistor 10 has a control electrode G, a first and second load terminal D, S, and a load path between the first and second load terminals D, S. MOS transistor 10 also comprises a control capacitance 11 which is connected to control electrode G and which is present in any MOS transistor. For the a better understanding, this internal control capacitance is shown in FIG. 1 as a separate component 11 which is connected between control electrode G and the load terminals D, S.

The MOS transistor shown in FIG. 1 is implemented as an n-channel MOSFET. A gate electrode G of the MOSFET here forms the control electrode; the drain and source terminals D, S form the load path terminals of this transistor. In this component, control capacitance 11 corresponds to the gate-source capacitance present between gate G and source S. It should be pointed out that the invention is not limited to using an n-channel MOSFET as the MOS transistor. It is of course understood that, for example, a p-channel MOSFET or an IGBT can also be employed as the MOS transistor. MOSFET 10 functions, for example, to switch an electric load Z, for which purpose the load path D-S is connected in series to the load Z between terminals for a first and second supply voltage Vs, GND.

Transistor 10 can assume two different switching states, a conducting state in which the load path D-S is low-ohmic such that approximately the entire supply voltage is applied across load Z, and a non-conducting state in which load path D-S is high-ohmic such that the supply voltage is applied across MOSFET 10. The switching state of MOSFET 10 is a function of an electrical potential at gate electrode G relative to source terminal S, and thus a function of an electrical voltage V11 across gate-source capacitance 11.

The control circuit comprises an input for supplying a control signal Sin and an output connected to the gate electrode G for providing a drive signal S20 for MOS transistor 10. In the example of FIG. 1, drive signal S20 is a control current for MOS transistor 10. The sign of the control current is a function of control signal Sin. The control current either charges gate-source capacitance 11 so as to conductively control MOS transistor 10, or discharges the gate-source capacitance so as to non-conductively control, or block, MOS transistor 10.

In order to illustrate the control operations for the conductive and nonconductive control of MOS transistor 10, FIG. 2 shows, by way of example, the time characteristics for control signal Sin and gate-source voltage V11. FIG. 2 also shows time characteristics for a load current or drain current Ids through MOSFET 10 as well as for the load path voltage or drain-source voltage Vds across MOSFET 10 for the circuitry of MOSFET 10 shown in FIG. 1. In the example, control signal Sin is a two-valued signal which can alternately assume a first control level or low level, and a second control level or high level. In the diagram of FIG. 2, it is assumed that MOSFET 10 is controlled non-conductively given a low level for control signal Sin, and controlled conductively given a high level for control signal Sin. In the diagram of FIG. 2, it is also assumed that given a high level for control signal Sin a constant charge current flows through drive circuit 20 to the gate electrode of MOS transistor 10 and thus to the gate-source capacitance, and that given a low level a constant discharge current drains from the gate electrode of MOS transistor 10, and thus from the gate-source capacitance.

With reference to FIG. 2, a conductive control of MOS transistor 10 begins at time t1 at which control signal Sin assumes a high level. Starting from this time t1, gate-source voltage 11 rises at first approximately linearly in response to the charging of gate-source capacitance 11 until the component begins to turn on at a subsequent time t12, as is evident in FIG. 2 by the rise in drain current Ids or in the fall of the drain-source current. The gate-source current, starting from which the transistor begins to turn on, is identified as the threshold voltage Vth. Upon reaching this threshold voltage, the slope of gate-source voltage V11 first flattens out until at a later time t13 it again rises more steeply until it reaches a maximum value. The maximum value here is determined by a voltage supply from the drive circuit 20. The passage through the flatter curve by gate-source voltage V11 is termed the "Miller plateau." This flatter slope of the gate-source voltage during time period t12-t13 is caused by a gate-drain capacitance present in MOSFET 10, as indicated by the dashed line in FIG. 1 and reference number 12. As MOSFET 10 begins to turn on starting at time t12, this gate-drain capacitance 12 is also charged by the charge current, thereby resulting in a reduced voltage rise across gate-source capacitance V11.

In response to a non-conducting control of MOS transistor 10 starting at time t2, a discharge of gate-source capacitance 12 proceeds at first approximately linearly until reaching the Miller plateau, is then flattened during the Miller plateau until MOS transistor 10 is disabled, and then again proceeds more steeply until the gate-source capacitance is completely discharged.

FIG. 2 shows three different time characteristics for gate-source voltage V11, drain-current Ids, and drain-source voltage Vds, of which one time characteristic is indicated by thick lines and the two other time characteristics are indicated by thinner lines. These time characteristics, which in particular differ with respect to the slope of their switching edges for drain-source current Ids and of drain-source voltage Vds, result from the different capacitance values of the gate-source capacitance. The edge curves here become steeper as this gate-source capacitance becomes smaller.

The gate-source capacitance of a MOS transistor is subject to fabrication-related fluctuations, with the result that even though identical drive circuits are used, the edge slope values for different MOS transistor can vary. In order to preclude any effect from fabrication-related fluctuations in the gate-source capacitance on the edge slope during switching operations of the MOS transistor, calibration circuit 30 is provided which is connected to gate electrode G of MOSFET 10 and which is designed to generate a calibration signal S30 which is dependent on a capacitance value of gate-source capacitance 11. This calibration signal S30 is fed to drive circuit 20 which sets an amplitude of control current S20 as a function of this calibration signal S30.

Figure 3:
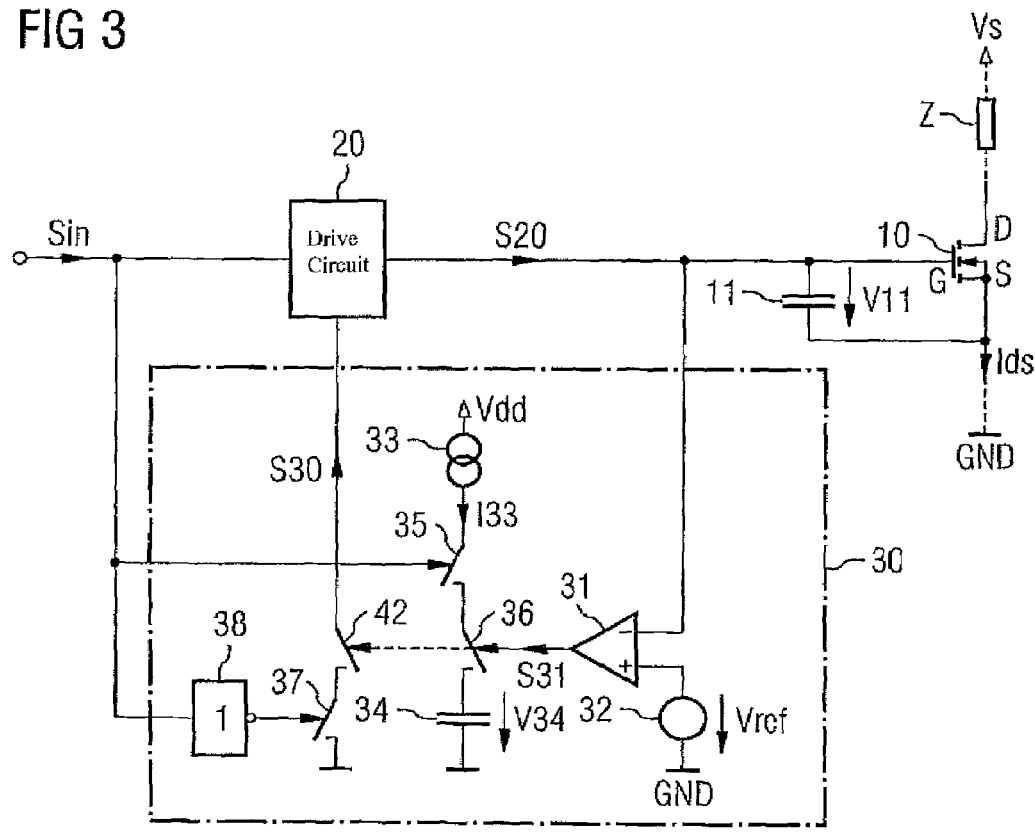
FIG. 3 illustrates an example of the calibration circuit to supply an analog calibration signal.

An example of the circuitry of calibration circuit 30 is shown in FIG. 3. In response to a high signal from control circuit Sin, this calibration circuit 30 determines the time period which elapses until the gate-source capacitance reaches a predetermined charge state for charge current S20 supplied by drive circuit 20. Calibration signal S30 provided by this calibration circuit 30 here is dependent on this time period and thus on the capacitance value of gate-source capacitance 11. In calibration circuit 30 shown in FIG. 3, the charge state of gate-source capacitance 11 is determined by comparing the gate-source voltage V11 with a reference voltage Vref. A comparator 31 is provided for this purpose which is connected to gate electrode G of MOS transistor 10, and which compares gate-source voltage V11 to reference voltage Vref provided by a reference voltage source 32. A time measuring unit controlled by control signal Sin and comparator 31 is provided to determine the time period during which gate-source capacitance 11 is charged until gate-source voltage G11 reaches reference value Vref.

In the example, this time measuring unit comprises a current source 33 and a capacitive storage element 34, a capacitor in the example, which is connected in series between a terminal for a logic potential Vdd and a terminal for reference potential GND. Control of this time measuring unit is effected by two switches 35, 36 which are connected in series to current source 33 and capacitor 34, and of which one, 35, is driven by control signal Sin and the other, 36, is driven by comparator 31. In this arrangement, the time measurement signal, and thus the calibration signal, correspond to a voltage V34 across capacitor 34.

The following explains the functional principle of the calibration circuit 30 shown in FIG. 3. Assuming that MOS transistor 10 is disabled and that gate-source capacitance 11 is completely discharged, with the result that gate-source voltage V11 is zero. Reference voltage Vref is greater than zero and is thus greater than gate-source voltage V11 given a non-conductively controlled MOS transistor 10. Comparator 31 is interconnected such that during a switching state in which reference voltage Vref is greater than gate-source voltage V11 it conductively controls switch 36. A control operation for the conductive control of MOS transistor 10 starts when control signal Sin assumes a high level. At this time, additional switch 35, which is series-connected between current source 33 and capacitor 34, is also closed, by which action capacitor 34 is charged by a current I33 supplied by current source 33. As a result, voltage V34 across capacitor 34 rises linearly over time. The instantaneous value of this capacitor voltage V34 thus directly represents a measured value for the time that has elapsed since the start of the control operation.

At the start of the control operation, drive circuit 20 supplies a constant charging current as control current S20 to MOS transistor 10, with the result that the transistor's gate-source capacitance 11 is charged continuously and gate-source voltage V11 rises. When voltage V11 reaches the value of reference voltage Vref, further charging of capacitor 34 of the time measuring unit is interrupted by comparator 31 and switch 36, and time measurement is halted. Capacitor voltage V34 is then directly proportional to the time period between the start of the control operation and the end of the time measurement, designated subsequently as measurement period Tm. This capacitor voltage V34, and hence measurement period Tm, is immediately proportional to the capacitance value of gate-source capacitance 11 with a known charge current S20. The capacitor voltage V34 as a function of measurement time Tm is yielded by the equation:

$$Tm = \frac{T34 \cdot V34}{I33}. \qquad (1)$$

T34 here denotes the capacitance of capacitor 34, which capacitance is known; I33 denotes the charge current, also known, supplied by current source 33. Measurement period Tm is thus directly proportional to voltage V34 applied through capacitor 34 at the end of the time measurement period.

Measurement period Tm is additionally determined by the comparison of gate-source voltage V11 with reference voltage Vref, for which the equation is:

$$Tm = \frac{C11 \cdot Vref}{I20}. \qquad (2)$$

C11 here denotes the capacitance value of the gate-source capacitance, while I20 denotes the constant charge current supplied by drive circuit 20 after the start of the control operation. Measurement period Tm, and thus charge current V34, are thus directly proportional to capacitance value C11 of gate-source capacitance 11.

The information, in the form of capacitor voltage V34, about the capacitance value C11 of gate-source voltage 11 obtained at the end of the measurement period is then utilized during the subsequent evolution of the control operation in drive circuit 20 to adjust the charge current or control current S20 to the capacitance value C11 of this gate-source capacitance. Drive circuit 20 here can be implemented, for example, such that it first supplies a charge current with a predetermined set-point value, and such that this charge current is increased or reduced relative to the current set-point value, as a function of whether gate-source capacitance 11 lies above or below a predetermined set-point value. In order to achieve a condition in which capacitor voltage V34 is supplied as calibration signal S30 to drive circuit 20 only at the end of the measurement period, an additional switch 42 is optionally provided which is controlled by comparator signal S31 and which is switched between capacitor 34 and drive circuit 20. The additional switch dependent on the comparator signal is switched on and off in complementary manner as compared to switching on and off switch 36.

Reference voltage Vref is preferably selected so as to be smaller than the threshold voltage of MOS transistor 10. This achieves a situation in which the calibration operation to set the charge current of drive circuit 20 is completed before the MOS transistor begins to conduct.

In the circuit shown in FIG. 3, a calibration is effected with each turn-on operation. Capacitor 34 of calibration circuit 30 here is discharged by a switch 37 parallel-connected to capacitor 34, which switch is controlled through an inverter 38 by control signal Sin whenever control signal Sin assumes a low value, that is, when MOS transistor 10 is controlled to be nonconductive.

Figure 4:
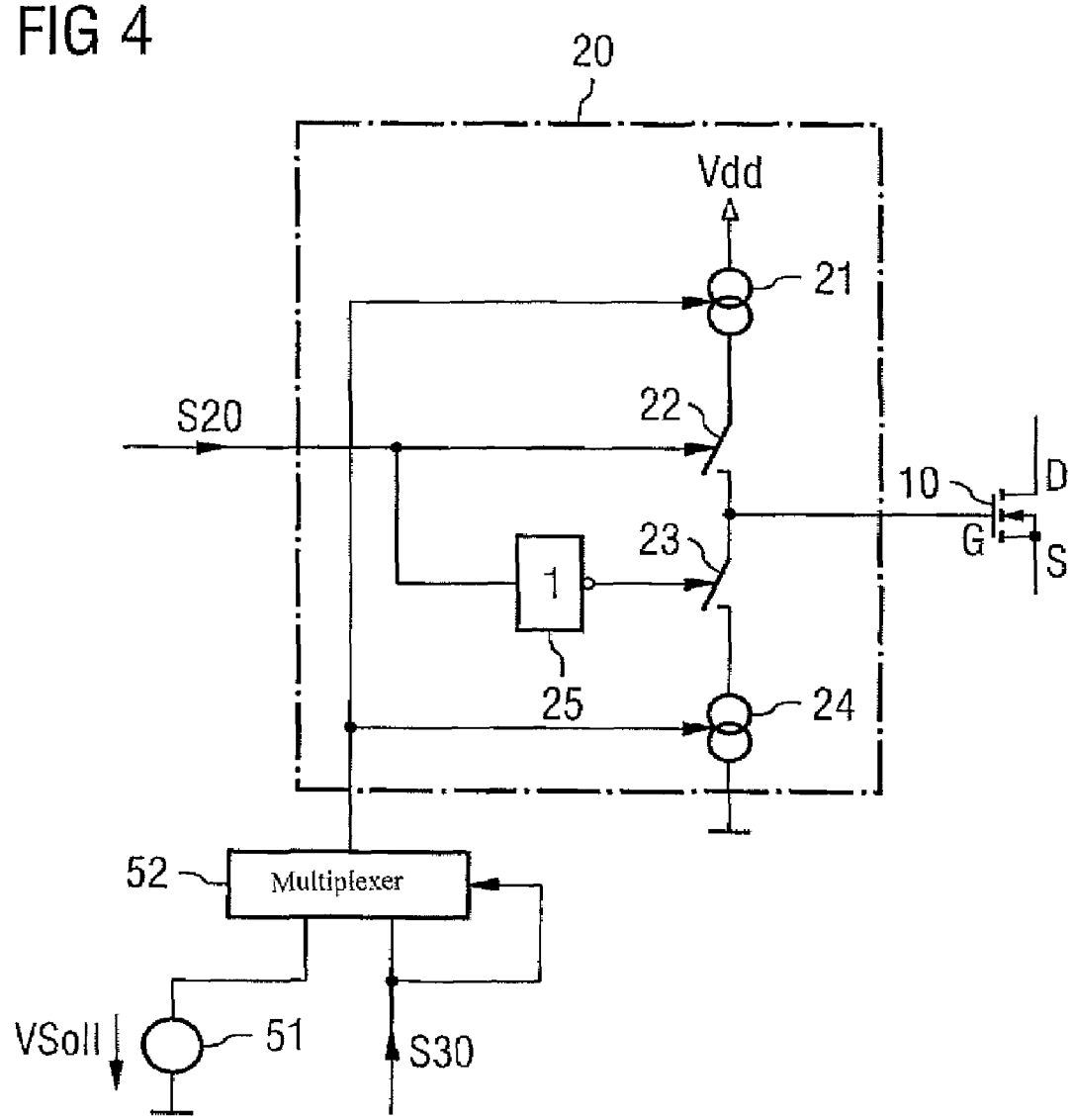
FIG. 4 shows an example of the drive circuit.

An example of circuitry implementing drive circuit 20 is shown in FIG. 4. This drive circuit comprises two current sources, a first current source 21 which is connected between a terminal for a first supply potential Vdd and the output of drive circuit 20 or gate electrode G of MOS transistor 10, and a second current source 24 which is connected between the output and a terminal for a second supply potential GND.

First current source 21 functions in this drive circuit 20 to supply a charge current I21 for conductive control of MOS transistor 10, while second current source 24 functions to supply a discharge current I24 for nonconductive control of MOS transistor 10. The two current sources 21, 24 are each controlled in complementary manner relative to each other by control signal Sin. Switches 22, 23 are provided to control these current sources, of which switches a first switch is connected between first current source 21 and the output of drive circuit 20, and a second switch 23 is connected between the output of drive circuit 20 and second current source 24. These two switches 22, 23 are controlled in a complementary manner relative to each other by control signal S20. This is achieved, for example, by having switch 22 controlled directly by control signal S20 while second switch 23 is controlled by control signal S20 through an inverter 25. The two current sources 21, 24 are implemented in the form of voltage-controlled current sources to which calibration signal S30 is fed as the setting signal to set the current intensity. A voltage source 51 is provided to set the current of current sources 21, 24 to a base value or set-point value when calibration signal S30 is zero, which voltage source supplies a set-point voltage Vsoll. A multiplexer 52 supplies either the value of this set-point voltage Vsoll or the value of calibration signal S30 to current sources 21, 24 as the current setting signal. Calibration signal S30 serves as the switching signal for the multiplexer, wherein, in response to a calibration signal S30 equal to zero, the multiplexer passes on set-point voltage Vsoll as the setting signal to current sources 21, 24, while in response to a calibration signal not equal to zero the multiplexer passes on the value of calibration signal S30.

Figure 5:
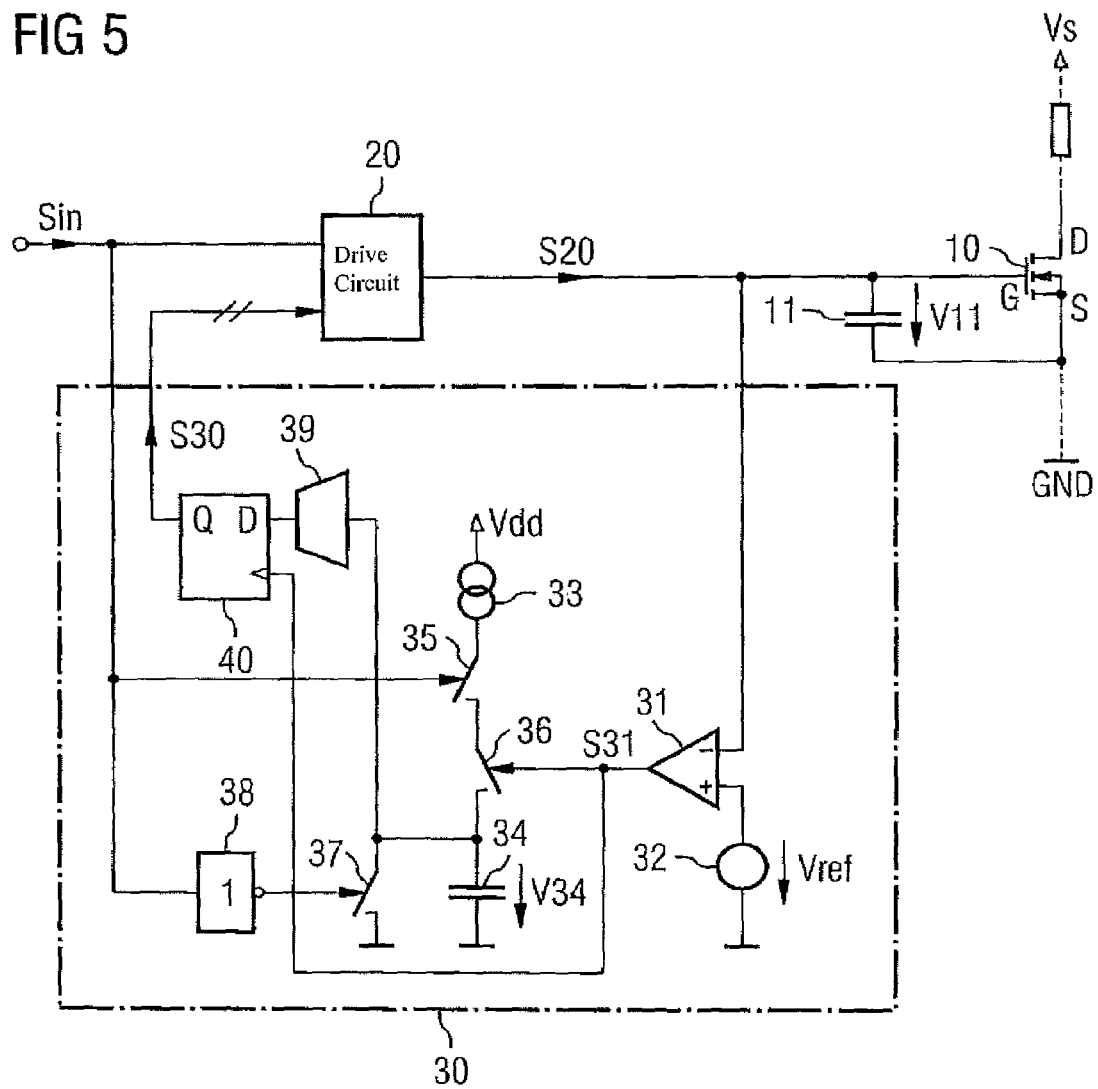
FIG. 5 shows an example of the calibration circuit supplying a calibration signal.

FIG. 5 shows another example of calibration circuit 30. This calibration circuit 30 differs from that shown in FIG. 3 by the generation of calibration signal S30. In the calibration circuit shown in FIG. 5 the calibration signal S30 is a digital signal which is supplied at the output of a register 40. In this example, capacitor voltage V34 of capacitor 34 of the time measuring unit is supplied to an analog-to-digital converter 39 which provides a digital value corresponding to capacitor voltage V34. This digital value supplied by analog-to-digital converter 39 is supplied to register 40 through the register's data input D at the end of the measurement period. This is achieved by supplying output signal S31 of comparator 31 to the clock input or charging input of register 40, which signal changes at the end of the measurement period from a high level to a low level. Register 40 here is a negative-edge-triggered register.

Figure 6:
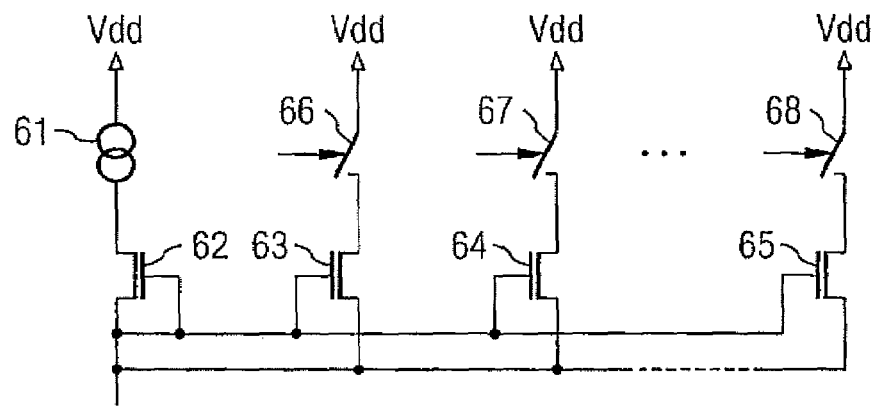
FIG. 6 shows another example of the calibration circuit.

Drive circuit 20 of the circuit shown in FIG. 5 can be implemented analogously to the drive circuit of FIG. 4—with the difference that current sources 21, 24 must be implemented as digitally controlled current sources. With reference to FIG. 6, this type of digitally controlled current source can be implemented as a current mirror arrangement which has a first current path with a current source 61 and a first transistor 62, as well as a number of additional current paths with current mirror transistors 63, 64, 65. These additional current paths can be turned on or turned off as a function of the numerical value of calibration signal S30. The total current of this current source arrangement corresponds to the sum of the currents flowing through the individual current paths.

In the examples described above, measurement of the time period during which gate-source capacitance 11 is charged to the value of reference voltage Vref is effected by an analog time measurement arrangement which comprises a current source 33 and a capacitor 34. In the system of FIG. 3, the analog measurement result is used as calibration signal S30, while in the system of FIG. 5 the analog measurement result is digitized by an analog-to-digital converter.

Figure 7:
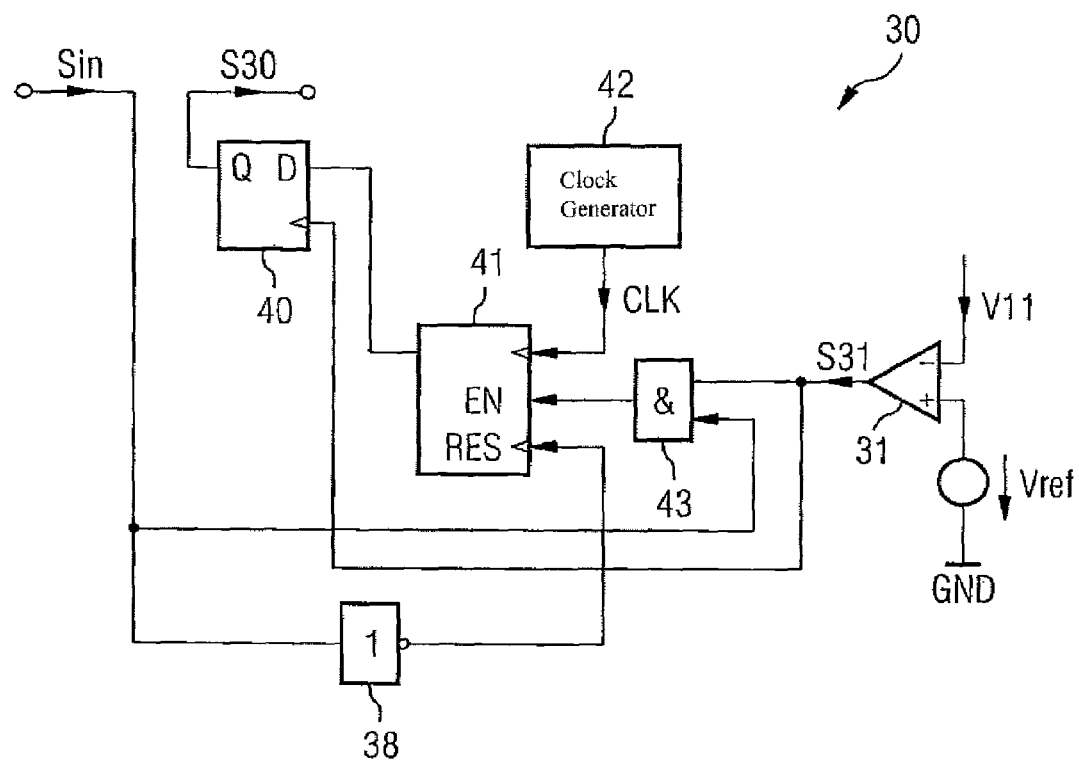
FIG. 7 shows yet another example of the calibration circuit.

It is of course also possible to replace the analog measuring device with a digital measuring device which, at the start of a rising edge for control signal Sin, is incremented in time with a clock signal until gate-source voltage V11 reaches reference voltage Vref. A possible example of such "digital" calibration circuit is shown in FIG. 7. The calibration circuit comprises a counter 41 having a clock input, an enable input EN, a reset input RES and an output. Counter 41 receives a clock signal CLK at its clock input provided by a clock generator 42. Counter 41 is enabled dependent on the comparator output signal S31 and on control signal Sin, wherein counter 41 is incremented with each cycle of clock signal CLK when being enabled. In FIG. 7 an AND gate 43 receiving the control signal Sin and the output signal S31 of comparator 31 enables counter 41, wherein counter 41, for example, is enabled if control signal Sin and comparator output signal S31 have high signal levels, i.e. if gate source voltage V11 is below the reference voltage Vref and if transistor (10 in FIG. 1) is to be driven in conductive mode.

The output of counter 41 is connected to data input D of register 40 which provides the calibration signal S30. At that output of counter 41 a counter value is available which, in enabled state, is incremented with each clock cycle of clock signal CLK.

With the circuit of FIG. 7 the calibration period equals the period of time for which counter 41 is enabled, which is the time during which counter 41 is incremented starting from a given start value. In FIG. 7 the calibration period starts at the time of a rising edge of control signal Sin and ends at the time of the gate source voltage V11 reaching reference voltage Vref. At the end of the calibration period the counter value at the output of counter 41 is stored in register 40 which provides calibration signal 30. Storing the counter value in register 41 is controlled by the output signal S31 of comparator 31. In the present example a falling edge of the comparator signal marks the end of the calibration period; register 40 is therefore loaded with a falling edge of the comparator signal.

Assuming that counter 41 is reset prior to beginning or with beginning of the calibration period, then the value of counter 41 at the end of the calibration period is directly dependent on the length of calibration period and therefore directly dependent on the capacitance value of gate source capacitance 11. In the circuit of FIG. 7 the calibration signal S30 is calculated at the beginning of each control cycle which is governed by control signal Sin. Resetting the counter 41 prior to a calibration period is performed using control signal Sin, which via inverter 38 is provided to the reset input RES of counter 41. Counter 41 in the example of FIG. 7 is reset with a rising edge of its reset signal, i.e. with a falling edge of control signal Sin. Counter 41 is therefore reset at the end of each control cycle.

The invention claimed is:

1. A circuit comprising a MOS transistor with a control electrode and a control capacitance, and comprising a control circuit for the MOS transistor, comprising:
    an input for supplying a control signal and an output for providing a drive signal, the output being connected to the control electrode of the MOS transistor;
    a calibration circuit connected to the control electrode of the MOS transistor, for generating a calibration signal dependent on a capacitance value of the control capacitance; and
    a drive circuit for generating the drive signal based on the control signal and having an amplitude dependent on the calibration signal.

2. The circuit according to claim 1, wherein the calibration circuit is configured to determine a time period during which the control electrode capacitance charges to a predetermined charge state after a start of a control operation of the MOS transistor.

3. The circuit according to claim 1, wherein the calibration circuit comprises:
    a capacitive charge storage element;
    a current source connected in series to the charge storage element;
    a first switch connected in series to the current source and the charge storage element;
    a comparator unit operably coupled to drive the first switch dependent on a voltage across the control capacitance and a reference voltage.

4. The circuit according to claim 3 wherein the calibration circuit further comprises a second switch connected in series with charge storage element, the first switch being driven by the control signal.

5. The circuit according to claim 3 wherein the charge storage element is configured to provide the calibration signal.

6. The circuit according to claim 3, wherein the calibration circuit further comprises an analog-to-digital converter having an input connected to the charge storage element and an output;
    a register element having an input connected to the output of analog-to-digital converter and having an output providing the calibration signal.

7. The circuit according to claim 6, wherein the register comprises a charging input operably coupled to receive a signal dependent on an output signal of the comparator unit.

8. The circuit according to claim 1, wherein the calibration circuit further comprises:
    a counter having a clock input, an enable input and an output;
    a register receiving a counter value from the output of the counter;
    a comparator unit operably coupled to enable the counter dependent on a voltage across the control capacitance and a reference voltage.

9. The circuit according to claim 8, wherein the counter comprises a reset input configured to receive a signal dependent on the control signal.

10. A circuit arrangement, comprising:
    a MOS transistor with a control electrode and a control electrode capacitance,
    an input configured to receive a control signal and an output operably coupled to provide a drive signal to the control electrode of the MOS transistor;
    a calibration circuit connected to the control electrode of the MOS transistor, the calibration circuit configured to generate a calibration signal dependent on a capacitance value of the control capacitance;
    a drive circuit configured to generate the drive signal based on the control signal, and such that the drive signal has an amplitude dependent at least in part on the calibration signal.

11. The circuit according to claim 10, wherein the calibration circuit is configured to determine a time period during which the control electrode capacitance charges to a predetermined charge state after a start of a control operation of the MOS transistor.

12. The circuit according to claim 11, wherein the calibration circuit comprises:
    a charge storage element;

a current source connected in series to the charge storage element;

a first switch connected in series to the current source and the charge storage element;

a comparator unit operably coupled to drive the first switch dependent on a voltage across the control electrode capacitance and a reference voltage.

13. The circuit according to claim 10, wherein the calibration circuit comprises:

a charge storage element;

a current source connected in series to the charge storage element;

a first switch connected in series to the current source and the charge storage element;

a comparator unit operably coupled to drive the first switch dependent on a voltage across the control electrode capacitance and a reference voltage.

14. The circuit according to claim 13 wherein the calibration circuit further comprises a second switch connected in series with charge storage element, wherein the first switch is driven by the control signal.

15. The circuit according to claim 13 wherein the charge storage element is configured to provide the calibration signal.

16. The circuit according to claim 13, wherein the calibration circuit further comprises an analog-to-digital converter having an input connected to the charge storage element and an output;

a register element having an input connected to the output of analog-to-digital converter and having an output providing the calibration signal.

17. The circuit according to claim 16, wherein the register comprises a charging input operably coupled to receive a signal dependent on an output signal of the comparator unit.

18. The circuit according to claim 10, wherein the calibration circuit further comprises:

a counter having a clock input, an enable input and an output;

a register receiving a counter value from the output of the counter;

a comparator unit operably coupled to enable the counter dependent on a voltage across the control capacitance and a reference voltage.

19. The circuit according to claim 18, wherein the counter comprises a reset input configured to receive a signal dependent on the control signal.

20. A circuit arrangement for use with a MOS transistor having a control electrode and a control capacitance, the circuit arrangement comprising:

an input configured to receive a control signal and an output operably coupled to provide a drive signal to the control electrode of the MOS transistor;

a calibration circuit connected to the control electrode of the MOS transistor, the calibration circuit configured to generate a calibration signal dependent on a capacitance value of the control capacitance; and a drive circuit configured to generate the drive signal based on the control signal, and such that the drive signal has an amplitude dependent at least in part on the calibration signal.

* * * * *